US008533548B2

(12) United States Patent
Kim et al.

(10) Patent No.: US 8,533,548 B2
(45) Date of Patent: Sep. 10, 2013

(54) WRAPPER CELL FOR HIERARCHICAL SYSTEM ON CHIP TESTING

(75) Inventors: Kyuchull Kim, Seoul (KR); Kewal K. Saluja, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 510 days.

(21) Appl. No.: 12/944,295

(22) Filed: Nov. 11, 2010

(65) Prior Publication Data

US 2012/0124439 A1    May 17, 2012

(51) Int. Cl.
*G01R 31/28* (2006.01)

(52) U.S. Cl.
USPC .......................................... 714/731; 714/727

(58) Field of Classification Search
None
See application file for complete search history.

(56) References Cited

U.S. PATENT DOCUMENTS

| | | | | | |
|---|---|---|---|---|---|
| 5,459,737 | A | * | 10/1995 | Andrews | 714/733 |
| 5,859,657 | A | * | 1/1999 | Donahue et al. | 347/237 |
| 6,122,762 | A | * | 9/2000 | Kim | 714/726 |
| 6,886,122 | B1 | * | 4/2005 | Barthel | 714/727 |
| 2008/0244343 | A1 | * | 10/2008 | Grealish et al. | 714/727 |
| 2011/0221502 | A1 | * | 9/2011 | Meijer et al. | 327/333 |

OTHER PUBLICATIONS te Beest and Peeters, "A Multiplexer Based Test Method for Self-Timed Circuits", 2005, IEEE.*
Goel, Sandeep Kumar, Testing of SoCos with Hierachical Cores: Common Falacies, Test Access Optimization, and Test Scheduling, vol. 58, No. 3, Mar. 2009, pp. 409-423, IEEE Computer Society, New York, NY, USA.
Marinissen, Erik Jan, et al., IEEE Std 1500 Enables Modular SoC Testing, Jan./Feb. 2009, pp. 8-16, IEEE Design & Test of Computers, IEEE CS and IEEE CASS, IEEE, New York, NY, USA.

* cited by examiner

*Primary Examiner* — Gabriel Chu
(74) *Attorney, Agent, or Firm* — Boyle Fredrickson S.C.

(57) ABSTRACT

Wrapper cells for simultaneous testing of parent functional elements and child functional elements in a hierarchical SoC (System on Chip) provide a substantially reduced integrated circuit footprint by eliminating a multiplexer and providing simpler interconnections. Identical wrapper cells may be used for input and output data lines reducing the cost of the cell library.

20 Claims, 5 Drawing Sheets

INPUT CELL

OUTPUT CELL

WRAPPER CELL FOR HIERARCHICAL SYSTEM ON CHIP TESTING

STATEMENT REGARDING FEDERALLY SPONSORED RESEARCH OR DEVELOPMENT

This invention was made with government support under 0811467 awarded by the National Science Foundation. The government has certain rights in the invention.

CROSS REFERENCE TO RELATED APPLICATIONS

- -

BACKGROUND OF THE INVENTION

The present invention relates to test circuitry for integrated circuits and in particular to an improved wrapper cell permitting the injection and extraction of signals into and out of an integrated circuit for testing of the integrated circuit.

Complex integrated circuits must be individually tested as part of the manufacturing process. This testing process applies a predetermined test sequence to the inputs of the circuit and monitors the outputs of the circuit to see that they conform to the expected outputs for a properly functioning circuit.

System on a chip (SoC) integrated circuits, and other complex integrated circuits, combine multiple functional elements on a single substrate. For example, such systems can combine digital, analog, mixed signal, and radiofrequency functional elements on a single substrate to produce a more complex device such as microcontroller or cell phone. Commonly, an SoC design will provide for logic functional elements with embedded non-logic blocks of functional elements including memories, custom-designed coprocessors, analog to digital converters, phase locked loops, FPGAs and the like.

Often these functional elements are designed by different commercial entities and/or are proprietary, representing in functional element "black boxes" in which the user must rely on a test sequence unique to that functional element and developed by others. Or, for reasons of managing the complexity of the testing process, it may be necessary to test the combined functional elements separately.

In either case, it is known to embed circuitry within the integrated circuit allowing isolated testing of the different internal functional elements. This circuitry is typically termed a "wrapper" and comprises, in part, a series of "wrapper cells" which can be placed at points of interconnection between functional elements to allow the monitoring of signals at the those interconnections and the injection of test signals at those interconnections.

Often wrapper cells may be arranged so that test data (both input and output data) can be shifted into and out of the cells in the manner of a shift register along a limited number of I/O lines. This approach reduces the total pin count of the integrated circuit package. One standard for making such wrapper cells is IEEE standard 1500 which will be described in more detail below.

Commonly, functional elements of complex integrated circuit are arranged in a hierarchical or parent-child fashion. Such functional elements may be termed "parent" and "child" cores the term "core" referring to any functional element not necessarily a processor. A child core may be a parent of other child cores.

Conventional wrapper cells per IEEE standard 1500 do not permit simultaneous testing of the parent and child core. This was recognized in the paper: Goel S K, Marinissen E J, Sehgal A, Chakrabarty K (2009) Testing of SoC's with Hierarchical Cores: Common Fallacies, Test Access Optimization, and Test Scheduling IEEE Trans Computers 58(3):409-423. This paper proposed a new wrapper cell comprising two memory elements (flip-flops) and three to four multiplexers in contrast to the IEEE standard 1500 wrapper core having two multiplexers and one memory element.

SUMMARY OF THE INVENTION

The present invention provides an improved wrapper cell for hierarchical integrated circuits significantly reducing the complexity over previously proposed wrapper cells for this purpose. The invention may reduce the area of the integrated circuit used for wrapper cells by approximately 13 to 23 percent through reduced gate count and simplified wiring. In addition, a single wrapper cell per the present invention may be used for both input and output data monitoring reducing the cost of the cell library.

Specifically, the present invention provides wrapper cells for use in a hierarchical SoC having at least a first and second interconnected functional element on a substrate, the functional elements having data lines providing inputs and outputs. The wrapper cells are placed in series with data lines and include: a functional input receiving an output from the first functional element; a functional output providing an input to the second functional element; two test data inputs each for receiving test data; and two test data outputs each for outputting test data. The wrapper cell uses no more than two data storage elements each holding one binary bit and significantly requires no more than two multiplexers each switching a common output between two inputs according to corresponding control signals defining multiplexer states. These elements are interconnected by conductors so that the multiplexers may be switched to (a) connect the functional input to the first data storage element; (b) connect the functional output to the second data storage element; (c) connect a first of the test data inputs to a first of the test data outputs through the first data storage element; and (d) connect a second of the test data inputs to a second of the test data outputs through the second data storage element.

It is thus one feature of at least one embodiment of the invention to eliminate one multiplexer in a wrapper cell that may contemporaneously test both parent core and child core for efficient testing of hierarchical integrated circuits.

The connections of (a) and (b) may be formed in a first single state of the multiplexers and the connections of (c) and (d) may be formed in a second single state of the multiplexers different than the first single state.

It is thus one feature of at least one embodiment of the invention to permit simplified control of the multiplexers and simultaneous testing of both parent core and child core in a hierarchical SoC.

The first functional input may be received by one input of each of the two multiplexers and an output of the second multiplexer provides the first functional output, and one test data input may be received by the remaining input of the first multiplexer whose output is received by an input of a first memory element whose output provides a first test data output; and the second test data input may be received at the input of the second memory element whose output is received by remaining input of the second multiplexer and which forms the second test data output.

It is thus one feature of at least one embodiment of the invention to provide a simplified interconnection between the elements that may further reduce costs of implementing each wrapper cell.

The first and second functional elements may have a relationship of parent and child.

It is thus one feature of at least one embodiment of the invention to provide an improved wrapper cell for hierarchical systems permitting simultaneous testing of parent and child cores.

The wrapper cells on both inputs and outputs of the functional elements may have identical circuitry.

It is thus one feature of at least one embodiment of the invention to reduce the cost of developing a wrapper cell library employing the present invention.

The data storage elements are clocking flip-flops.

It is thus one feature of at least one embodiment of the invention to employ logically well-known and simple data storage devices.

The test data inputs for at least some given wrapper cells may be connected to the test data outputs of at least one of the wrapper cells and the test data outputs for the given wrapper cells may be connected to the test data input of at least one wrapper cell.

It is thus one feature of at least one embodiment of the invention to permit standard shift register type loading and unloading of the wrapper cells.

These particular objects and advantages may apply to only some embodiments falling within the claims and thus do not define the scope of the invention.

DETAILED DESCRIPTION OF THE PREFERRED EMBODIMENT

Figure 1:
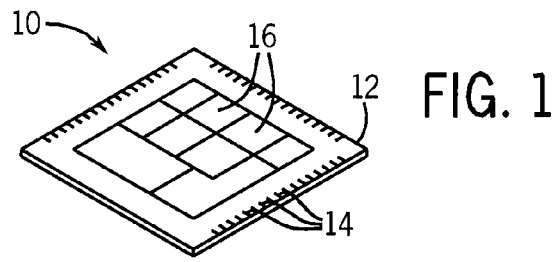
FIG. 1 is a simplified perspective view of an integrated circuit showing regions occupied by different functional elements.

Referring now to FIG. 1, an integrated circuit 10 may provide a substrate 12 having multiple functional elements 16 formed on its surface and having interconnection pads 14 that may connect the functional elements of the substrate to a lead frame or the like around its periphery. Conventionally, the substrate 12 may be a silicon wafer that is doped, etched, and otherwise processed according to conventional integrated circuit techniques to form the functional elements 16 (e.g., IP cores) directly thereon. Alternatively, substrate 12 may be a secondary material to which fully processed integrated circuits are attached for interconnection.

The functional elements 16 (e.g., IP cores) may be formed by a variety of different integrated circuit techniques, for example, producing CMOS, TTL, NMOS as well as technologies used for linear, analog and radiofrequency circuitry.

Figure 2:
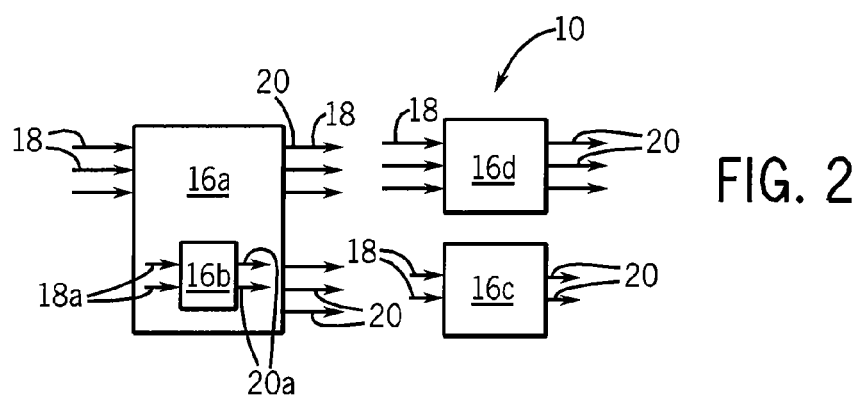
FIG. 2 is a block diagram of several functional elements showing flat and hierarchical relationships between the functional elements.

Referring now to FIG. 2, functional elements 16a-d may have input lines 18 receiving binary data and output lines 20 outputting binary data. In hierarchical designs, some of the functional elements 16 will have a "parent-child" relationship as is the case with functional elements 16a and 16b (as depicted) in which functional element 16a is the parent of child functional element 16b. In this type of relationship, the child functional element 16b communicates only with parent functional element 16a through exclusive input and output lines 18a and 20a As depicted, the functional elements 16d and 16c are considered "flat" with functional element 16a. These flat functional elements 16 may share common input lines and output lines (for examples sharing a common bus) but are not embedded one within the other.

Figure 3:
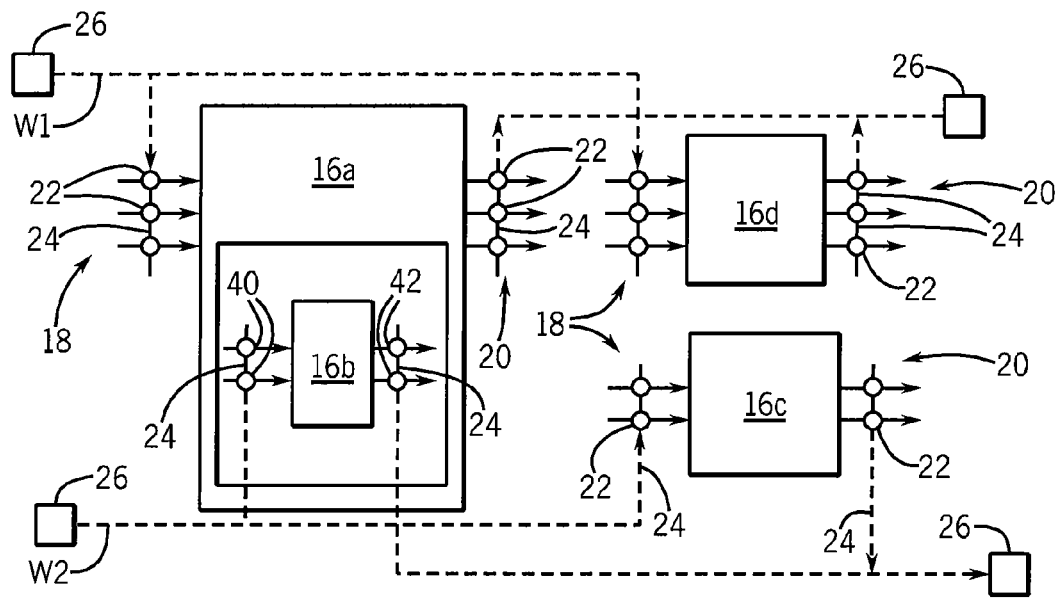
FIG. 3 is a more detailed version of FIG. 2 showing the placement of wrapper cells at inputs and outputs of functional elements for testing of the functional elements.

Referring now to FIG. 3, the present invention provides special wrapper cells 40 and 42 that may be placed on the input lines 18a or output lines 20a of the child functional elements 16b to monitor the signals going into these devices and exiting these devices and to inject signals into the input of these devices. For flat functional elements 16 a, 16d, and 16c the IEEE STD. 1500 wrapper cells 22 are used on their input and output.

As is generally understood in the art, the wrapper cells 22, 40 and 42 may be joined by test data lines 24 allowing data collected by the wrapper cells 22, 40 and 42 to be shifted out in the form of a shift register driven by a clock signal (not shown) and for test data applied by the wrapper cells 22, 40 and 42 to the functional elements 16 to be shifted in by the shift register depending on whether the wrapper cells 22 are used on output lines or input lines of the functional elements 16. These test data lines 24 may be connected to external test equipment 26 of a type known in the art generating the necessary test input sequences, receiving the test data, and evaluating the functionality of the functional elements 16.

Figure 4:
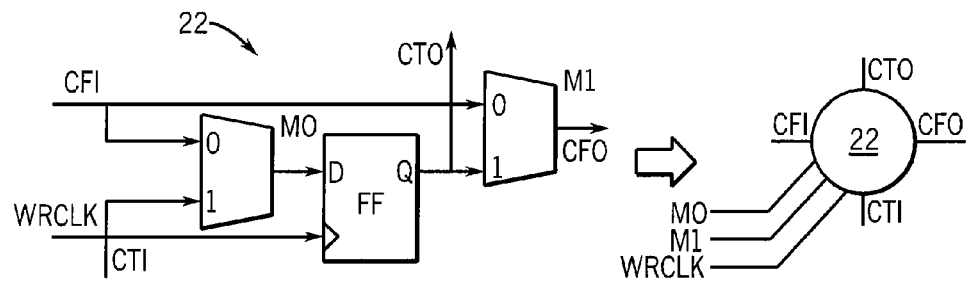
FIG. 4 is a block diagram and symbolic representation of a wrapper cell per IEEE standard 1500.

Referring now to FIG. 4, a prior art wrapper cell 22 provides a CFI (core functional input) that may receive data intended to be input to a functional element 16 on input line 18 when the wrapper cell 22 is on input line 18. Alternatively, the CFI may receive an output from the functional elements 16 when the wrapper cell 22 is placed on output line 20. The wrapper cell also provides a CFO (core functional output) that provides input to the functional element 16 in the former case and an output to another connected device in the latter case. CFI and CFO provide a path of normal dataflow along the input line 18 or output line 20 during normal operation of the integrated circuit in non-testing mode.

Wrapper cell 22 may also provide a CTI (core test input) and a CTO (core test output) allowing the communication of test data into or out of the wrapper cells 22 during the testing process.

Generally, the wrapper cell 22 also receives multiplexer control lines m0 and m1 which control the state of multiplexers (to be described) and a clock signal WRCLK that controls the shifting in or out of test data along lines of CTI and CTO. For clarity, the signals are omitted in the below described figures.

In this prior art wrapper cell design, described by the above-mentioned IEEE 1500 standard, the CFI line is received by the zero inputs of multiplexer m0 and multiplexer m1. As will be understood in the art, the zero input is the input connected to the multiplexer output when the multiplexer control signal is zero and the one input (to be described) is the input connected to the multiplexer output when the multiplexer control signal is one, the multiplexer serving essentially as a single pole dual throw switch.

The CTI is connected to the one input of multiplexer m0 and the output of that multiplexer is connected to the D input of a flip-flop FF. The Q output of the flip-flop FF connects to the CTO and also to the one input of multiplexer m1, whose output provides the CFO.

Figure 5:
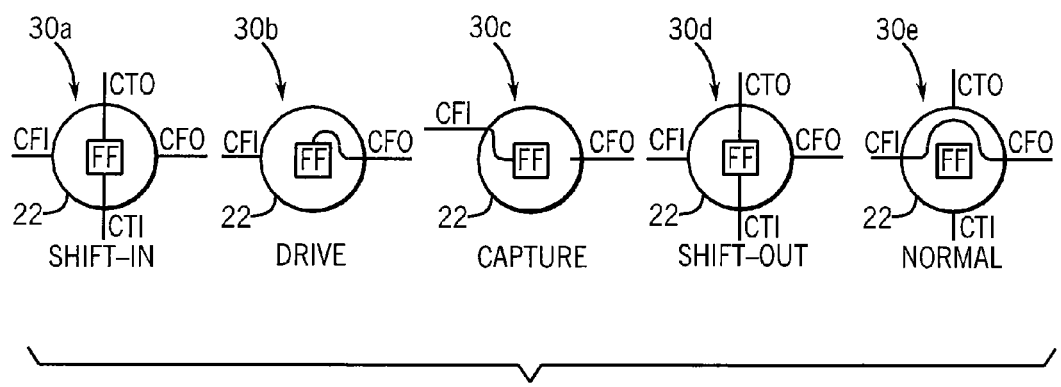
FIG. 5 is a set of diagrams showing different states of the wrapper cell of FIG. 4 for shift in, drive, capture and shift out.

Referring now to FIG. 5, it will be understood that by selecting different multiplexer states (defined by the combined states of multiplexers, m0 and m1) different operating modes can be implemented. Each of the multiplexer states can be realized by selecting the inputs to the multiplexers, m0 and m1, as will be evident from the following description and as will be understood in the art.

Referring still to FIG. 5, as indicated by a first state diagram 30a, the CTI may be connected through the flip-flop FF to the CTO allowing the shifting in of test data. This state is called the "shift-in state". Alternatively, as indicated by second state diagram 30b, the output of the flip-flop FF may be connected to the CFO allowing test data to be input to the connected functional element 16. This state is called the "drive state".

Alternatively, as shown by third state diagram 30c, the CFI may be connected to the input of the flip-flop FF allowing capture of the CFI. This state is called the "capture state". As indicated by fourth state diagram 30d, the CTI may be connected to the input of the flip-flop FF whose output is connected to the CFO allowing the shift-out of capture data from capture state of state diagram 30c. The fifth state diagram 30e shows the normal mode operation where CFI is connected directly to CFO.

Figure 6:
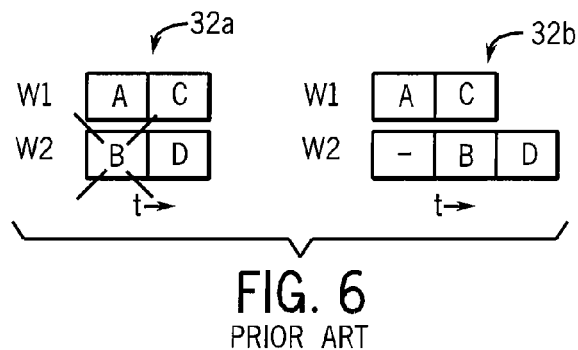
FIG. 6 is a first and second testing schedule for the system of FIG. 3 using the wrapper cells of FIG. 4 showing a lengthening of the testing process when using the wrapper cells of FIG. 4 in a hierarchical system.

Referring now to FIG. 6, as shown by test schedule 32a, the cell 22 of FIG. 4 cannot simultaneously capture and drive data as is required when the cell 22 is placed between the data lines of a parent functional element 16a and a child functional element 16b. Generally this is because only a single data storage element (flip-flop FF) is provided, requiring a choice between storing test data and storing capture data. Accordingly, as depicted by test schedule 32a, a parent functional element 16a and child functional element 16b cannot be simultaneously tested even under the assumption of separate test data lines (w1 and w2) because the wrapper cells 22 cannot both capture the output data from the parent functional element 16a and drive test data to the child functional element 16. For this reason during the test protocol shown in test schedule 32b, the child functional element must be in the ExTest mode while the parent functional element 16a is being tested and the testing of child functional element 16b itself is delayed until the testing of parent functional element 16a has been completed causing an extension of the total testing time. Particularly when every integrated circuit must be tested, this additional required testing time can substantially increase manufacturing cost.

Figure 7:
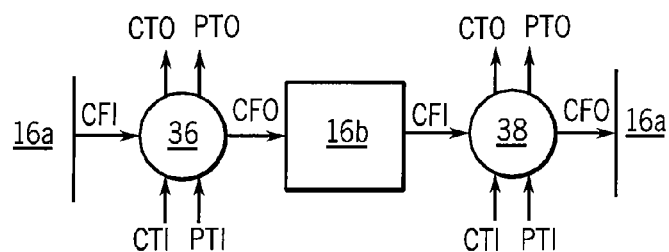
FIG. 7 is an expanded fragmentary view of the interconnection of a parent and child core of FIG. 3 showing use of modified prior art wrapper cells per Goel et al.

Referring now to FIG. 7, this deficiency in conventional wrapper cells 22 was recognized in the above referenced Goel paper and may be remedied by the use of improved wrapper cells 36 and 38. The wrapper cells 36 and 38 include new signal lines of: PTI (parent test input) and PTO (parent test output) in addition to CTI and CTO to handle the simultaneous testing of both parent core and child core.

Figure 8:
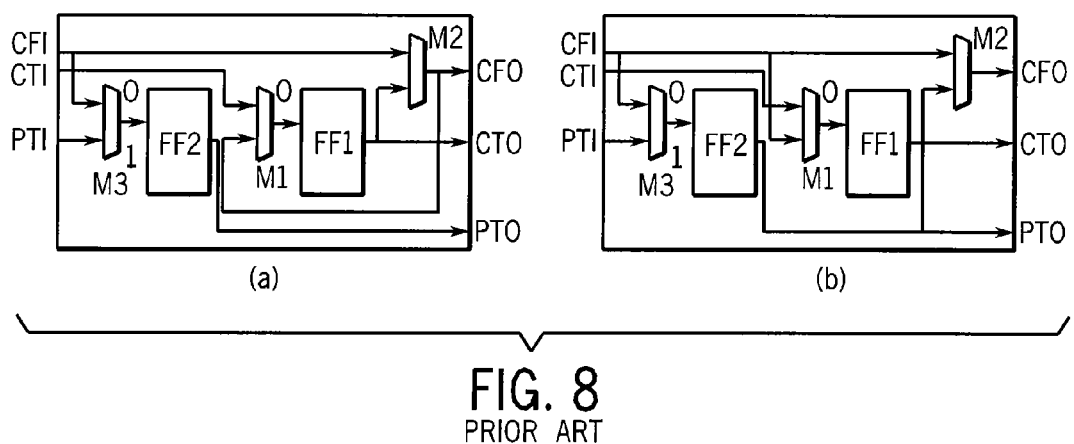
FIG. 8 is a block diagram of the wrapper cells of Goel having three multiplexers and two flip-flops.

Referring now to FIG. 8, the circuitry for the cells 36 and 38 includes three multiplexers, m1, m2 and m3, and two flip-flops, FF1 and FF2. By proper selection of the state of the multiplexers, the shift in, drive, capture and shift out states may be obtained to achieve simultaneous testing of parent and child functional elements 16 avoiding the problem discussed with respect to FIG. 6.

Figure 9:
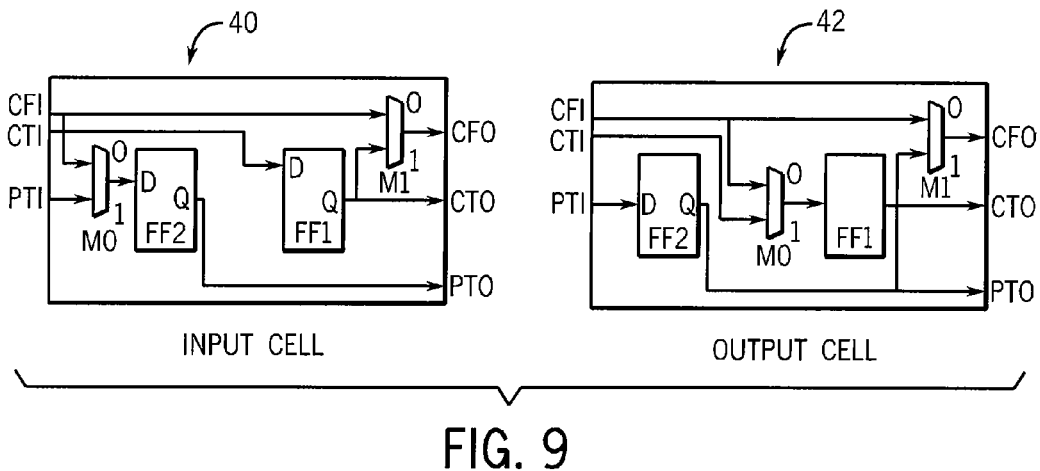
FIG. 9 is a figure similar to that of FIGS. 4 and 8 showing two wrapper cells per the present invention configured for input and output lines of functional elements.

Referring now to FIG. 9, the present invention provides alternative wrapper cells 40 and 42 which provide shift in, drive, capture and shift out states necessary for simultaneous testing of both parent functional element and child functional element.

The wrapper cells 40 and 42 of the present invention make three significant improvements on the prior art shown in FIG. 8. First and most obviously, one multiplexer has been eliminated in the present design to provide a wrapper cell 40 and 42 having only two multiplexers, m0 and m1. The savings in integrated circuit area from this elimination of one multiplexer can be roughly evaluated by considering the number of NAND-gates necessary to produce a multiplexer and the flip-flops of this circuit. Generally a flip-flop may be equivalent to seven two-input NAND-gates and a two-to-one multiplexer may be equivalent to three two-input NAND-gates. Accordingly, the present invention takes approximately 20 equivalent two-input NAND-gates while the prior art of FIG. 8 takes approximately 23 equivalent two-input NAND-gates. Thus, the present invention uses 13 to 23 percent less area on the integrated circuit with the resulting significant cost savings. In addition, it will be noted that the interconnecting wiring is simpler in the present invention which will also yield a reduced fabrication area. Finally, as will be described below, the present invention provides substantially the same design for both input and output wrapper cells 40 and 42 reducing the cell library cost.

Referring still to FIG. 9, the present invention provides for two multiplexers, m0 and m1, and two flip-flops, FF1 and FF2. Each of these components is individually constructed according to conventional design, in the same manner as those elements described above with respect to the prior art of FIGS. 4 and 9.

For the input wrapper cell 40, the CFI is received by the zero input of multiplexer m0 and a zero input of multiplexer m1. The PTI input is connected to the remaining (one) input of multiplexer m0 and the output of this multiplexer is connected to the D-input of flip-flop FF2. The output of flip-flop FF2 forms the PTO. The CTI is connected to the D input of the second flip-flop FF1, whose output forms the CTO, and is also conducted to the one input of multiplexer m1 whose output provides the CFO output.

For the output wrapper cell 42, the CFI line is received by the one input of multiplexer m0 and by the zero input of multiplexer m1. The CTI is received by the zero input of multiplexer m0 whose output is received by the D-input of flip-flop FF1. The output of this flip-flop provides the CTO. The PTI is received by the D input of flip-flop FF2 whose output is the PTO and is also conducted to the one input of multiplexer m1 whose output is the CFO.

The control of the multiplexer states (by means of their control lines) can be used to produce the shift in, drive, capture and shift out states per the following tables:

| Input wrapper cell (40) | | |
| --- | --- | --- |
| wrapper cell function | m0 control line | m1 control line |
| Shift in | X | X |
| Drive | X | 1 |
| Capture | 0 | X |
| Shift out | 1 | X |

| Output wrapper cell (42) | | |
| --- | --- | --- |
| wrapper cell function | m0 control line | m1 control line |
| Capture | 0 | X |
| Shift out | 1 | X |
| Shift in | X | X |
| Drive | X | 1 |

These charts indicate in the binary values of the input lines to the multiplexers and an X indicates a "don't care" state permitting either binary value of the input line to the multiplexer.

In the input wrapper cell (40) table, Shift in and Drive states are for InTest mode, and Capture and Shift out states are for ExTest mode. From the table, it is apparent that InTest mode and ExTest mode are compatible with each other, meaning that they can be implemented with a single set of multiplexer settings. Thus, InTest and ExTest can be performed simultaneously.

Similarly, in the output wrapper cell (42) table, Capture and Shift out states are for InTest mode, and Shift in and Drive states are for ExTest mode. From the table, it is apparent that InTest mode and ExTest mode are compatible with each other.

Figure 10:
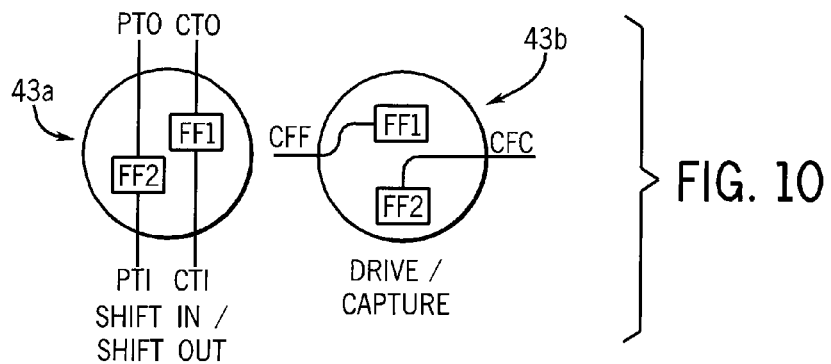
FIG. 10 is a figure similar to that of FIG. 5 showing simultaneous implementation of the shift in/shift out functions and drive/capture functions.

Note that InTest mode tests child functional element and ExTest mode tests parent functional element. Since the two modes are compatible with each other, both child functional element and parent functional element can be tested simultaneously. This is shown in FIG. 10 in the states 43*a* and 43*b*. It should be understood that a variety of other states 43 may also be implemented in the input wrapper cell 40 and output wrapper cell 42 with different settings of the multiplexers.

Figure 11:
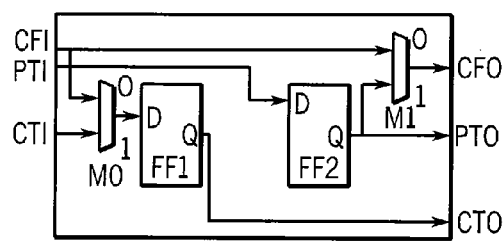
FIG. 11 is a figure similar to that of FIG. 9 showing the use of the same circuit topology for both of the cells of FIG. 9 by remapping of the inputs and outputs.

Referring to FIG. 11, it will be further appreciated that the same circuit elements and interconnections may be used for both of the wrapper cells 40 and 42 simply by changing the designation of the inputs and outputs as shown in FIG. 11 to provide the functionality of wrapper cell 42 of FIG. 9 using the circuitry of wrapper cell 40 of FIG. 9.

Figure 12:
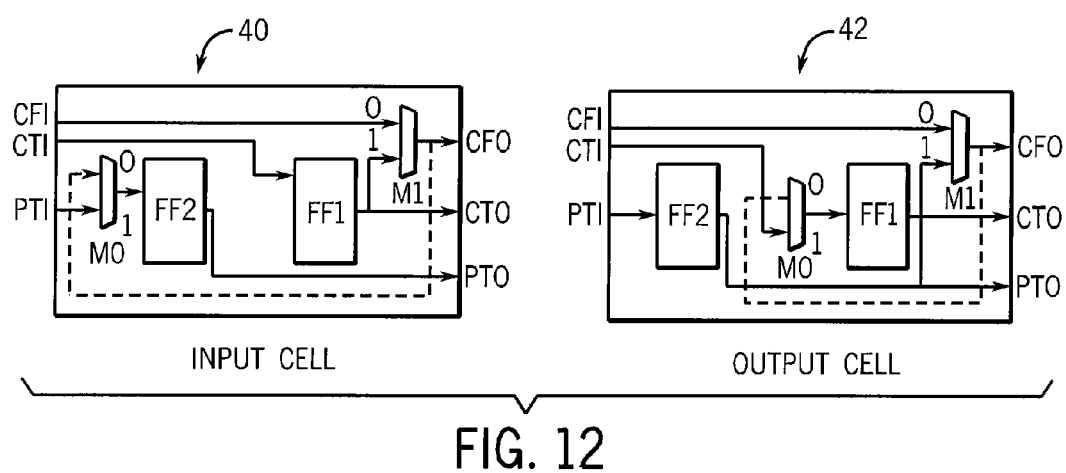
FIG. 12 is a figure similar to that of FIG. 9 showing a configuration of the cells of FIG. 9 for self-testing by using extra multiplexer states.

Note that for the input wrapper cell 40 and output wrapper cell 42 the upper leg of multiplexer m1 cannot be tested. This can be cured as follows. Referring to FIG. 12, for wrapper cell 40 by eliminating the direct input of the CFI to multiplexer m0 and providing this input instead from the output of multiplexer m1 as shown by the dotted line. Alternatively, a similar interconnection may be made with respect to wrapper cell 42 as shown.

Figure 13:
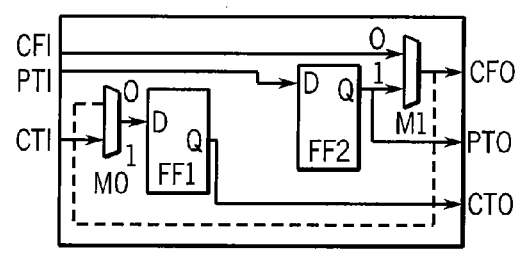
FIG. 13 is a figure similar to that of FIG. 12 showing the use of the same circuit topology for both of the cells of FIG. 12 by remapping of inputs and outputs.

Referring to FIG. 13, the same circuit elements and interconnections may be used for both of the wrapper cells 40 and 42 in FIG. 12 simply by changing the designation of the inputs and outputs as shown in FIG. 13 to provide the functionality of wrapper cell 42 of FIG. 12 using the circuitry of wrapper cell 40 of FIG. 12.

It will be appreciated that for certain integrated circuits or test protocols there may be some cases where a child functional element 16 cannot be tested in parallel with the parent functional element 16. In addition, some functional elements 16 may not have hierarchical relationships. In these cases, the standard IEEE 1500 wrapper cells may be used and, accordingly, a typical integrated circuit will employ both types of wrapper cells shown in FIGS. 4 and 9. Additional reductions in integrated circuit area may be obtained by mixed use of these wrapper cell types.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. In an integrated circuit having at least a first and second interconnected functional element on a substrate, the functional elements having data lines providing inputs and outputs, and a plurality of wrapper cells for integrated circuit testing placed in series with data lines of the first and second functional elements, the wrapper cells comprising:
   a functional input receiving an output from the first functional element;
   a functional output providing an input to the second functional element;
   two test data inputs each for receiving test data;
   two test data outputs each for outputting test data;
   no more than two data storage elements each holding one binary bit;
   no more than two multiplexers each switching a common output between two inputs according to corresponding control signals defining multiplexor states;
   interconnecting conductors between the inputs, outputs, data storage elements, and multiplexers so that the multiplexers may be switched to:
   (a) connect the functional input to the first data storage element;
   (b) connect the functional output to the second data storage element;
   (c) connect a first of the test data inputs to a first of the test data outputs through the first data storage element; and
   (d) connect a second of the test data inputs to a second of the test data outputs through the second data storage element.

2. The wrapper cells of claim 1 wherein the connections of (a) and (b) may be formed in a first single state of the multiplexers and the connections of (c) and (d) may be formed in a second single state of the multiplexers different than the first single state.

3. The wrapper cells of claim 1
wherein the functional input is received by one input of each of the two multiplexers and an output of a second multiplexer of the two multiplexers provides the first functional output;

wherein one test data input is received by the remaining input of a first multiplexer of the two multiplexers whose output is received by an input of a first memory element whose output provides a first test data output;

wherein the second test data input is received at the input of the second memory element whose output is received by remaining input of the second multiplexer of the two multiplexers and which forms the second test data output.

4. The wrapper cells of claim 1 wherein the first and second functional elements have a relationship of parent and child.

5. The wrapper cells of claim 1 wherein the plurality of wrapper cells are on both inputs and outputs of the second functional element and have identical circuitry.

6. The wrapper cells of claim 1 wherein the data storage elements are clocking flip-flops.

7. The wrapper cells of claim 1 wherein the test data inputs for at least some given wrapper cells are connected to the test data outputs of at least one of the wrapper cells and the test data outputs for the given wrapper cells are connected to the test data inputs of at least one wrapper cell.

8. An electronic computer executing a stored program to design integrated circuits having at least a first and second interconnected functional element on a substrate, the functional elements having data lines providing inputs and outputs, the stored program executing to allow placement of wrapper cells in series with data lines of the first and second functional elements, the wrapper cells comprising:
 a functional input receiving an output from the first functional element;
 a functional output providing an input to the second functional element;
 two test data inputs each for receiving test data;
 two test data outputs each for outputting test data;
 no more than two data storage elements each holding one binary bit;
 no more than two multiplexers each switching a common output between two inputs according to corresponding control signals defining multiplexor states;
 interconnecting conductors between the inputs, outputs, data storage elements, and multiplexers so that the multiplexers may be switched to:
 (a) connect the functional input to the first data storage element;
 (b) connect the functional output to the second data storage element;
 (c) connect a first of the test data inputs to a first of the test data outputs through the first data storage element;
 (d) connect a second of the test data inputs to a second of the test data outputs through the second data storage element.

9. The wrapper cells of claim 8 wherein the connections of (a) and (b) may be formed in a first single state of the multiplexers and the connections of (c) and (d) may be formed in a second single state of the multiplexers different than the first single state.

10. The wrapper cells of claim 8
wherein the functional input is received by one input of each of the two multiplexers and an output of a second multiplexer of the two multiplexers provides the first functional output;

wherein one test data input is received by the remaining input of a first multiplexer of the two multiplexers whose output is received by an input of a first memory element whose output provides a first test data output;

wherein the second test data input is received at the input of the second memory element whose output is received by remaining input of the second multiplexer of the two multiplexers and which forms the second test data output.

11. The wrapper cells of claim 8 wherein the first and second functional elements have a relationship of parent and child.

12. The wrapper cells of claim 8 wherein the wrapper cells are on both inputs and outputs of the second functional element and have identical circuitry.

13. The wrapper cells of claim 8 wherein the data storage elements are clocking flip-flops.

14. The wrapper cells of claim 8
wherein the test data inputs for at least some given wrapper cells are connected to the test data outputs of a least one of the wrapper cell and the test data outputs for the given wrapper cells are connected to the test data inputs of at least one wrapper cell.

15. A method of manufacturing an integrated circuit having at least a first and second interconnected functional element on a substrate, the functional elements having data lines providing inputs and outputs, the method comprising the steps of:
 placing a plurality of wrapper cells for integrated circuit testing in series with data lines of the first and second functional elements, the wrapper cells comprising:
 a functional input receiving an output from the first functional element;
 a functional output providing an input to the second functional element;
 two test data inputs each for receiving test data;
 two test data outputs each for outputting test data;
 no more than two data storage elements each holding one binary bit;
 no more than two multiplexers each switching a common output between two inputs according to corresponding control signals defining multiplexor states;
 interconnecting conductors between the inputs, outputs, data storage elements, and multiplexers so that the multiplexers may be switched to:
 (a) connect the functional input to the first data storage element;
 (b) connect the functional output to the second data storage element;
 (c) connect a first of the test data inputs to a first of the test data outputs through the first data storage element;
 (d) connect a second of the test data inputs to second of the test data outputs through the second data storage element.

16. The method of claim 15 wherein the connections of (a) and (b) may be formed in a first single state of the multiplexers and the connections of (c) and (d) may be formed in a second single state of the multiplexers different than the first single state.

17. The method of claim 15
wherein the functional input is received by one input of each of the two multiplexers and an output of a second multiplexer of the two multiplexers provides the first functional output;

wherein one test data input is received by the remaining input of a first multiplexer of the two multiplexers whose output is received by an input of a first memory element whose output provides a first test data output;

wherein the second test data input is received at the input of the second memory element whose output is received by remaining input of the second multiplexer of the two multiplexers and which forms the second test data output.

18. The method of claim 15 wherein the first and second functional elements have a relationship of parent and child.

19. The method of claim 15 wherein the plurality of wrapper cells are on both inputs and outputs of the second functional elements and have identical circuitry.

20. The method of claim 15 wherein the data storage elements are clocking flip-flops.

* * * * *